United States Patent
Hollis (10) Patent No.: US 9,691,444 B2
(45) Date of Patent: *Jun. 27, 2017

(54) BUFFER DIE IN STACKS OF MEMORY DIES AND METHODS

(71) Applicant: Micron Technology, Inc., Boise, ID (US)

(72) Inventor: Timothy M. Hollis, Poway, CA (US)

(73) Assignee: Micron Technology, Inc., Boise, ID (US)

(*) Notice: Subject to any disclaimer, the term of this patent is extended or adjusted under 35 U.S.C. 154(b) by 99 days.

This patent is subject to a terminal disclaimer.

(21) Appl. No.: 14/076,985

(22) Filed: Nov. 11, 2013

(65) Prior Publication Data

US 2014/0071771 A1 Mar. 13, 2014

Related U.S. Application Data

(63) Continuation of application No. 12/872,638, filed on Aug. 31, 2010, now Pat. No. 8,582,373.

(51) Int. Cl.
*G11C 5/04* (2006.01)
*G11C 7/10* (2006.01)
*G11C 5/02* (2006.01)

(52) U.S. Cl.
CPC .............. *G11C 7/10* (2013.01); *G11C 5/02* (2013.01); *G11C 7/1003* (2013.01)

(58) Field of Classification Search
CPC ....................................................... G11C 5/04
USPC .................................................. 365/189.05
See application file for complete search history.

(56) References Cited

U.S. PATENT DOCUMENTS

| | | | |
|---|---|---|---|
| 6,487,102 B1 | 11/2002 | Halbert et al. | |
| 8,582,373 B2 | 11/2013 | Hollis et al. | |
| 2003/0079909 A1 | 5/2003 | Nguyen et al. | |
| 2003/0178228 A1 | 9/2003 | Sung et al. | |
| 2004/0032240 A1* | 2/2004 | Kirn | 323/280 |
| 2006/0039205 A1 | 2/2006 | Cornelius | |

(Continued)

FOREIGN PATENT DOCUMENTS

| | | |
|---|---|---|
| CN | 1181131 A | 5/1998 |
| CN | 1484833 A | 3/2004 |

(Continued)

OTHER PUBLICATIONS

"Elpida Completes Development of Cu-TSV (through Silicon Via) Multi-Layer 8-Gigabit DRAM", Elpida News Release, Tokyo Japan., [Online]. Retrieved from the Internet: <URL: http://www.elpida.com/en/news/2009/8-27.html>, (Aug. 27, 2009), 2 pgs.

(Continued)

*Primary Examiner* — Min Huang
(74) *Attorney, Agent, or Firm* — Schwegman Lundberg & Woessner, P.A.

(57) ABSTRACT

Memory devices and methods of making and operating them are shown. Memory devices shown include stacked memory dies with one or more buffer dies included. In one such memory device, a command die communicates with one or more downstream memory dies through the one or more buffer dies. The one or more buffer dies function to repeat signals, and can potentially improve performance for higher numbers of memory dies in the stack.

19 Claims, 6 Drawing Sheets

(56) References Cited

U.S. PATENT DOCUMENTS

| | | | |
|---|---|---|---|
| 2007/0058410 A1* | 3/2007 | Rajan | G11C 5/02 365/63 |
| 2007/0165457 A1 | 7/2007 | Kim | |
| 2008/0027697 A1* | 1/2008 | Rajan et al. | 703/14 |
| 2008/0080261 A1* | 4/2008 | Shaeffer et al. | 365/189.05 |
| 2008/0082610 A1 | 4/2008 | Breise et al. | |
| 2009/0294974 A1* | 12/2009 | Leung et al. | 257/772 |
| 2010/0052096 A1 | 3/2010 | Urakawa | |
| 2010/0091541 A1 | 4/2010 | Park et al. | |
| 2010/0102434 A1 | 4/2010 | Kang et al. | |
| 2010/0200998 A1 | 8/2010 | Furuta et al. | |
| 2011/0194326 A1* | 8/2011 | Nakanishi et al. | 365/51 |
| 2011/0208906 A1 | 8/2011 | Gillingham | |
| 2011/0272788 A1 | 11/2011 | Kim et al. | |
| 2012/0051152 A1 | 3/2012 | Hollis | |
| 2013/0119542 A1* | 5/2013 | Oh | H01L 25/0657 257/738 |

FOREIGN PATENT DOCUMENTS

| | | |
|---|---|---|
| CN | 1511240 A | 7/2004 |
| CN | 101410814 A | 4/2009 |
| CN | 101681222 A | 3/2010 |
| CN | 101715593 A | 5/2010 |
| EP | 1385351 A1 | 1/2004 |
| JP | 2008077779 A | 4/2008 |
| JP | 2008544437 A | 12/2008 |
| JP | 2009507324 A | 2/2009 |
| JP | 2009510562 A | 3/2009 |
| JP | 2009526323 A | 7/2009 |
| JP | 2010182368 A | 8/2010 |
| JP | 2013516020 A | 5/2013 |
| TW | 573145 B | 1/2004 |
| TW | 200916858 A | 4/2009 |
| TW | 201017855 A | 5/2010 |
| TW | 201027348 A | 7/2010 |
| TW | 201214655 A | 4/2012 |
| WO | WO-2009079772 A1 | 7/2009 |
| WO | WO-2012030955 A2 | 3/2012 |
| WO | WO-2012030955 A3 | 3/2012 |

OTHER PUBLICATIONS

"International Application Serial No. PCT/US2011/049957, International Preliminary Report on Patentability mailed Mar. 14, 2013", 6 pgs.

"International Application Serial No. PCT/US2011/049957, Search Report mailed Feb. 28, 2012", 3 pgs.

"International Application Serial No. PCT/US2011/049957, Written Opinion mailed Feb. 28, 2012", 4 pgs.

Kang, Uksong, et al., "8 Gb 3-D DDR3 DRAM Using Through-Silicon-Via Technology", IEEE Journal of Solid State Circuits, 45(1), (Jan. 2010), 111-119.

"Japanese Application Serial No. 2013-526208, Office Action mailed Oct. 7, 2014", w/English Translation, 4 pgs.

"European Application Serial No. 11822557.2, Extended European Search Report mailed Feb. 28, 2014", 8 pgs.

"European Application Serial No. 11822557.2, Office Action mailed Mar. 18, 2014", 1 pg.

"Chinese Application Serial No. 201180047391.7, Office Action mailed Mar. 25, 2015", W/ English Translation, 25 pgs.

"Chinese Application Serial No. 201180047391.7, Office Action mailed Nov. 11, 2015", W/ English Translation, 8 pgs.

"Chinese Application Serial No. 201180047391.7, Response filed Jan. 26, 2016 to Office Action mailed Nov. 11, 2015", W/ English Claims, 20 pgs.

"Chinese Application Serial No. 201180047391.7, Response filed Jul. 30, 2015 to Office Action mailed Mar. 25, 2015", W/ English Claims, 14 pgs.

"European Application Serial No. 11822557.2, Preliminary Amendment Filed Oct. 21, 2013", 3 pgs.

"European Application Serial No. 11822557.2, Response filed Sep. 8, 2014 to Extended European Search Report mailed Feb. 28, 2014", 8 pgs.

"Japanese Application Serial No. 2013-526208 Response filed Dec. 26, 2014 to Office Action mailed Oct. 31, 2014", W/ English Claims, 14 pgs.

"Taiwanese Application Serial No. 100131326 Resposne filed May 29, 2015 to Office Action mailed Mar. 6, 2015", W/ English Claims, 22 pgs.

"Taiwanese Application Serial No. 100131326, Office Action mailed Feb. 26, 2015", W/ English Translation, 3 pgs.

\* cited by examiner

BUFFER DIE IN STACKS OF MEMORY DIES AND METHODS

PRIORITY APPLICATION

This application is a continuation of U.S. application Ser. No. 12/872,638, filed Aug. 31, 2010, which is incorporated herein by reference in its entirety.

TECHNICAL FIELD

Various embodiments described herein relate to semiconductor memory systems and methods.

BACKGROUND

Stacking semiconductor memory dies has been proposed as a method to increase memory capacity, while keeping the same memory device footprint. By scaling memory dies upward, storage density is dramatically increased. However, as more and more memory dies are stacked on top of one another, a technical hurdle of signal strength and integrity arises. For example higher dies in the stack experience more signaling capacitance from components such as bond pads between dies, and parasitic losses from circuits on each die that signals must pass through in order to reach higher dies in the stack.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and chemical, structural, logical, electrical changes, etc. may be made.

The term "horizontal" as used in this application is defined as a plane parallel to the conventional plane or surface of a wafer, die, or substrate, regardless of the orientation of the wafer, die, or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
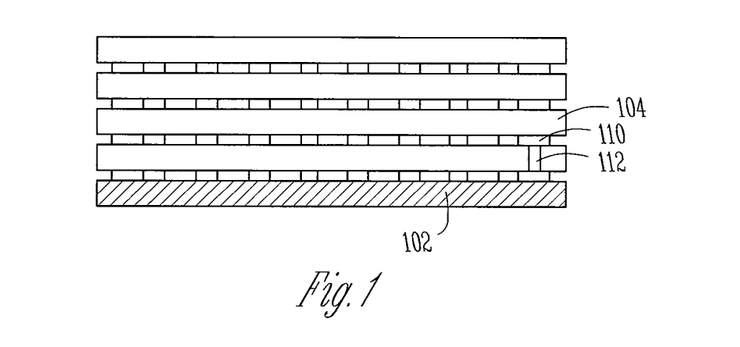
FIG. 1 shows a memory device according to an embodiment of the invention.

FIG. 1 shows a memory device 100, including a command die 102 and a stack of memory dies 104 coupled to the command die 102. In one example, the command die 102 includes logic configured to operate the memory dies 104, such as address circuitry, processor interface circuitry, etc. In one example the command die 102 includes only logic circuitry for operating the memory dies 104. In other examples, the command die 102 is also configured to function as a memory die. Memory density can be increased at a lower cost using configurations with a command die 102 operating more than one memory die 104. For example, logic circuitry can be avoided in each memory die 104. Although device 100 is described chiefly as a memory device, the scope of the invention also includes stacks of dies that include additional functionality, such as dedicated logic dies, processing dies, etc. Selected devices 100 include system-in-package (SiP) devices.

FIG. 1 also shows a number of communication paths coupling the dies in the memory device 100. In one example the communication paths comprise bond pads 110 coupled to a number of corresponding through semiconductor vias 112 (TSVs). One TSV 112 is shown for illustration, however TSV's can be included between other combinations of bond pads to form one or more TSVs. More than one configuration of TSVs are possible, as will be described in embodiments below. Other examples of communication paths include, but are not limited to, inductive coupling configurations and capacitive coupling configurations (e.g. AC coupled links).

Figure 2A:
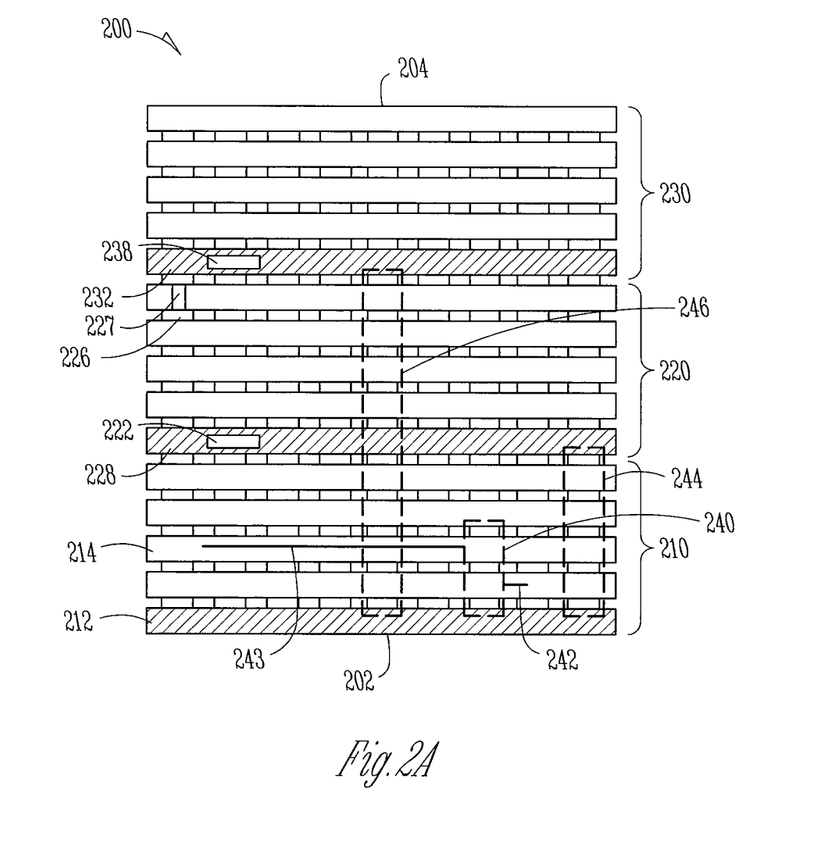
FIG. 2A shows another memory device according to an embodiment of the invention.

FIG. 2A shows a memory device 200 according to an embodiment of the invention. A command die 212 is shown coupled to communicate with a number of stacked memory dies 214. An upstream end 202 and a downstream end 204 of the memory device 200 are shown. In one embodiment, the command die 212 is located at the upstream end 202. In one example, the command die 212 interfaces between the memory dies 214 and a processor (not shown). Memory signals, such as data, address information, commands, etc. pass though the command die 212 at the upstream end 202 and travel from the memory device 200, towards the downstream end 204, to a selected memory die 214.

A first buffer die 222 is shown coupled between the command die 212 and a number of downstream memory dies 214. In one embodiment, the first buffer die 222 is configured to repeat signals sent between the command die 212 and memory dies 214 that are downstream from the first buffer die 222. Adding a buffer die to the stack of dies in the memory device 200 is believed to improve signal quality and strength to better communicate with downstream memory dies 214.

In one example, some memory dies 214 are located between the command die 212 and the first buffer die 222. These memory dies 214 are within a relatively short distance from the command die 212, and communication is acceptable without an intermediate buffer die for a given number of memory dies 214. FIG. 2A illustrates four memory dies 214 between an intermediate buffer die and something at the other end. However one of ordinary skill in the art, having the benefit of the present disclosure, will recognize that other numbers of dies between buffer dies or the command die are possible, and depend on signal degradation for a given configuration.

In one example the first buffer die 222 repeats signals in a downstream direction, such as to improve signal quality and strength to memory dies that are physically downstream of the first buffer die 222. In another example, the first buffer die 222 also repeats signals to memory dies that are physically upstream from the first buffer die 222. In such an example, a signal from the command die 212 could travel up to the first buffer die 222, then back down to a memory die 214 that is between the first buffer die 222 and the command die 212. In selected examples, the first buffer die 222 can repeat to downstream dies only, upstream dies only, or a combination of both upstream and downstream dies.

In one example, the first buffer die 222 includes only repeater and buffer circuitry. In other examples, the first buffer die 222 is also configured to function as a memory die. In one example the first buffer die 222 is a command die 212, that is reconfigured to operate as a buffer die. Using a command die 212 as a first buffer die 222 provides an efficient method of forming a memory device 200, as is further described in FIG. 2B.

Figure 2B:
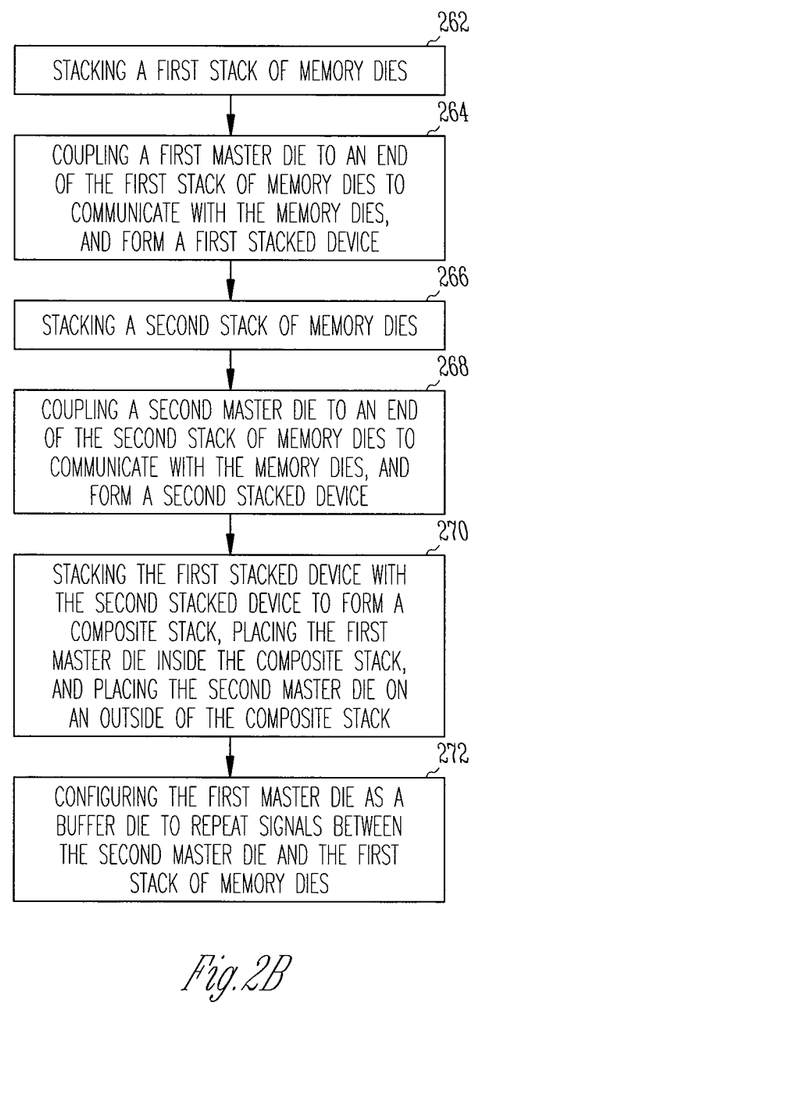
FIG. 2B shows a flow diagram of a method of forming a memory device according to an embodiment of the invention.

Operation 262 recites stacking a first stack of memory dies, and operation 264 recites coupling a first command die to an end of the first stack of memory dies to communicate with the memory dies, and form a first stacked device. In one example, the resulting first stacked device is similar to the memory device 100 shown in FIG. 1.

Operation 266 recites stacking a second stack of memory dies, and operation 268 recites coupling a second command die to an end of the second stack of memory dies to communicate with the memory dies, and form a second stacked device. In one example, the resulting second stacked device is also similar to the memory device 100 shown in FIG. 1.

Operation 270 recites stacking the first stacked device with the second stacked device to form a composite stack. Operation 270 describes a location of the first command die being inside the composite stack, and a location of the second command die being on an outside of the composite stack. Operation 272 then recites configuring the first command die as a buffer die to repeat signals between the second command die and the first stack of memory dies.

Using FIG. 2A as an example, a first stacked device 210 is shown, and a second stacked device 220. The example of FIG. 2A further illustrates a third stacked device 230. Although a configuration that may result from three stacked devices is shown in FIG. 2A, the number is only for illustration. Two or more stacked devices may be used in selected embodiments.

In embodiments that reconfigure an intermediate command die as a buffer die, manufacturing is simplified in contrast to stacking dedicated buffer dies along with command dies to form a memory device. Using the method of subsequent reconfiguration of selected command dies allows all stacked devices to be manufactured in the same way, and reconfigured using firmware or other modification. Although the method of FIG. 2B is shown as one method of manufacture, the invention is not so limited. For example, in other selected methods of manufacture, all or some of the individual dies in the memory device 200 can be coupled together one at a time, in contrast to first forming stacked devices such as memory device 100 from FIG. 1.

FIG. 2A further shows a number of TSVs 227 coupled to bond pads 226 for communication between dies in the memory device 200. As noted above, only one TSV 227 is illustrated as an example, however any number of TSV's are used to form communication paths between upstream dies and downstream dies. A set of TSVs forms a first TSV path 240 is illustrated in FIG. 2, showing example communication paths between the command die 212, and memory dies 214 within the memory device 200. The first TSV path 240, includes circuitry to communicate within selected dies as shown by connections 242 and 243.

A second TSV path 244 is also shown coupled between the command die 212 and the first buffer die 222. In one example, the second TSV path 244 includes communication circuitry to couple within selected dies, similar to the example shown by the first TSV path 240, and connections 242 and 243. In another example, the second TSV path 244 is a bypass TSV path. In one example, a bypass TSV path does not include connections, such as connections 242 and 243, to communicate with any dies between the command die 212, and a downstream buffer die. A bypass TSV path can be useful. For example, without the additional connections, such as connections 242 and 243, the bypass TSV path 244 should exhibit higher performance, such as lower resistance, lower capacitance, etc.

A third TSV path 246 is also shown. In one example, the third TSV path 246 is a bypass TSV that communicates between the command die 212, and a second buffer die 232. In one example, a set of TSVs may also be a hybrid configuration, such that memory dies 214 between the command die 212 and the first buffer die 222 are bypassed, but memory dies 214 between the first buffer die 222 and the second buffer die 232 may be accessed.

Although a first buffer die 222 and a second buffer die 232 are shown, the invention can be extrapolated to higher numbers of memory dies and buffer dies, depending on the requirements of the memory device 200.

FIG. 2A further illustrates an embodiment where the first buffer die 222 includes a first power regulation circuit 228, and the second buffer die 232 includes a second power regulation circuit 238. Power regulation circuits 228, 238, can be used to reduce noise in the buffer dies and provide cleaner, more repeatable signals to downstream dies. Examples of power regulation circuits include, but are not limited to, voltage boosting circuits (e.g. power amplification to downstream dies) and noise reduction circuits (e.g. to provide noise filtering).

In one embodiment, one or more power regulation circuits 228, 238, include power saving functionality. In one example one or more power regulation circuits 228, 238 are configured to put an associated die into a low power mode when the die has been idle for longer than a specified amount of time. Selected functionality such as die select communication circuitry may be maintained in order to wake a selected die up, if needed.

Figure 3:
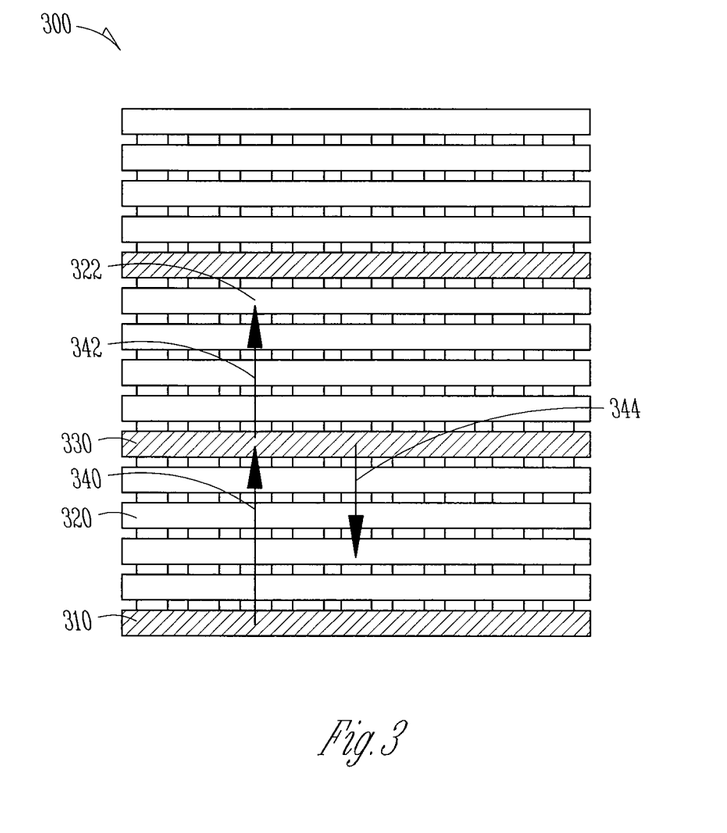
FIG. 3 shows a memory device and method of operation according to an embodiment of the invention.

In one example, communication between a command die and downstream memory dies includes serial communication. FIG. 3 illustrates an example of serial communication according to an embodiment of the invention. In FIG. 3, a memory device 300 includes a command die 310 and a number of downstream memory dies 320, similar to embodiments described above. A buffer die 330 is shown, located between a portion of the downstream memory dies 320.

For serial communication, a signal is sent from the command die 310 along path 340 to the buffer die 330. In the example shown, the signal passes through one or more TSVs, however the invention is not so limited. Other communication paths to the buffer die 330 may also be used. At the buffer die 330, the signal is repeated, and sent on from the buffer die 330 along path 342 to a downstream memory location 322. In a serial communication configuration, a single signal into the buffer die 330 results in a single signal out of the buffer die 330.

In another serial communication embodiment, a signal can be sent from the buffer die 330 to a further memory location that is downstream, either physically, as illustrated by path 342, or electrically (but physically upstream) as illustrated by path 344.

The above communication example only shows one way communication along a given TSV path from the command die 310 to the downstream memory location 322. In other embodiments, each TSV path includes bi-directional communication, where data is also returned from the downstream memory location 322, and repeated at the buffer die 330 as it travels back to the command die 310. If only one way signal repeating is used, capacitance may be decreased along a given TSV path, because less circuitry is required at each TSV node between dies. However, in such an embodiment, separate TSV paths are used for sending and receiving information. If bi-directional communication is used, throughput is higher than in a one way repeater communication.

Figure 4:
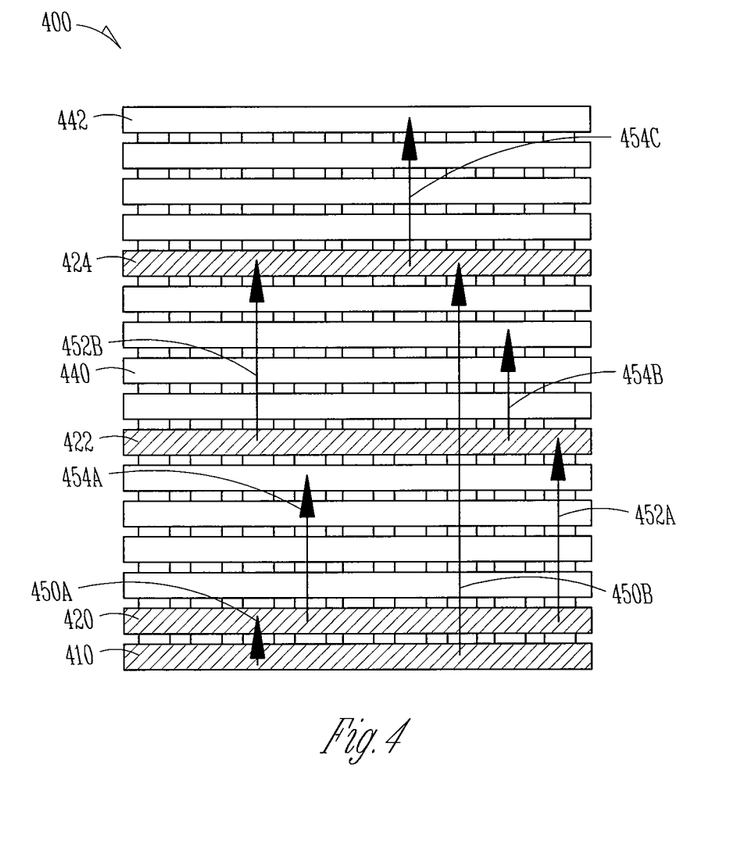
FIG. 4 shows another memory device and method of operation according to an embodiment of the invention.

In one example, communication between a command die and downstream memory dies includes parallel communication. In one example the parallel communication includes hierarchical organization of buffer dies. FIG. 4 illustrates an example of parallel communication according to an embodiment of the invention. As in the above examples, in FIG. 4, TSV paths are used, however the invention is not so limited. Other communication paths such as external traces or wiring may be used for selected communication paths.

In FIG. 4, a memory device 400 includes a command die 410 and a number of downstream memory dies 440, similar to embodiments described above. A first buffer die 420 is shown, located between the command die 410 and the downstream memory dies 440. A second buffer die 422 is shown, located downstream from the first buffer die 420, and within numbers of memory dies 440. A third buffer die 424 is shown, located downstream from the second buffer die 422, and within numbers of memory dies 440.

In one example, a first level signal in a hierarchy is sent from the command die 410 to a buffer die. Examples of first level signals shown in FIG. 4 include signals 450A and 450B. In one example, second level signals in the hierarchy are sent from buffer die to buffer die. Examples of second level signals shown in FIG. 4 include signals 452A and 452B. In one example, third level signals in the hierarchy are sent from buffer dies to locations within local stacks of memory dies 440. Examples of third level signals shown in FIG. 4 include signals 454A, 454B, and 454C.

In one example, communication between buffer dies or between a buffer die and the command die 410 uses a bypass TSV configuration, while communication between buffer dies and memory dies 440 use TSVs that include access to locations within each memory die 440. As a result, first level signals 450A and 450B and second level signals 452A and 452B encounter lower capacitance than third level signals 454A, 454B, and 454C.

In embodiments of parallel communication, latency to higher groups in the hierarchy may be reduced. Although the example of FIG. 4 illustrates first level communication utilizing a buffer die at the bottom of the memory device 400, the invention is not so limited. Another example include first level communication travelling to a middle of the memory device 400, with second level or third level communication travelling both upwards and downwards within the memory device 400.

In one example, the command die 410 makes all hierarchical decisions regarding signal paths to be used. In selected embodiments, at least a portion of hierarchical pathway control logic is located locally on individual buffer dies in the memory device 400.

Figure 5:
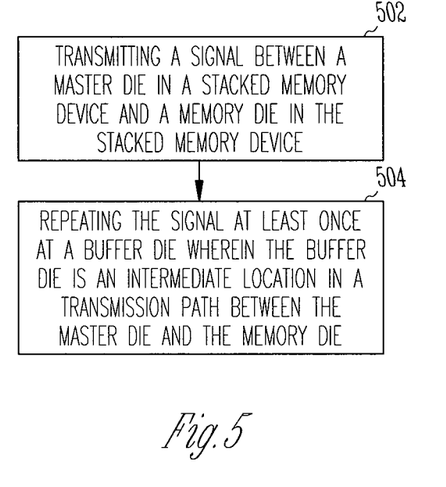
FIG. 5 shows a flow diagram of a method of operating a memory device according to an embodiment of the invention.

As discussed in embodiments above, FIG. 5 shows a method of operation of a memory device according to a described embodiment. Operation 502 recites transmitting a signal between a command die in a stacked memory device and a memory die in the stacked memory device. Operation 504 recites repeating the signal at least once using a buffer die wherein the buffer die is at an intermediate location in a transmission path between the command die and the memory die. As discussed above, transmitting the signal between the command die and the memory die may include one more buffer dies along the transmission path. The transmission may include serial or parallel communication, and may include a hierarchical arrangement. Further, as discussed above, repeating the signal at least once using a buffer die may include repeating to a physical downstream location, or to a physical upstream location from a given buffer die.

In one embodiment, all signal paths are the same regardless of command type. In selected embodiments, selected signal paths are different depending on varying criteria, such as command type. For example, in one embodiment, a write command follows a hierarchical pathway, while a read command is routed directly downward in the stack. In another example, a read command follows a hierarchical pathway, while a write command is routed directly upward in the stack. In addition to hierarchical pathways and direct pathways, another pathway type may include a point-to-point pathway. In one example, a point-to-point pathway includes a bypass TSV.

As stacks of memory dies become increasingly large, latency becomes more of an issue for dies that are located near a downstream end of a memory device. In one embodiment, data is prioritized before storage in the memory device, and lower priority data is stored in more remote locations than high priority data.

Figure 6:
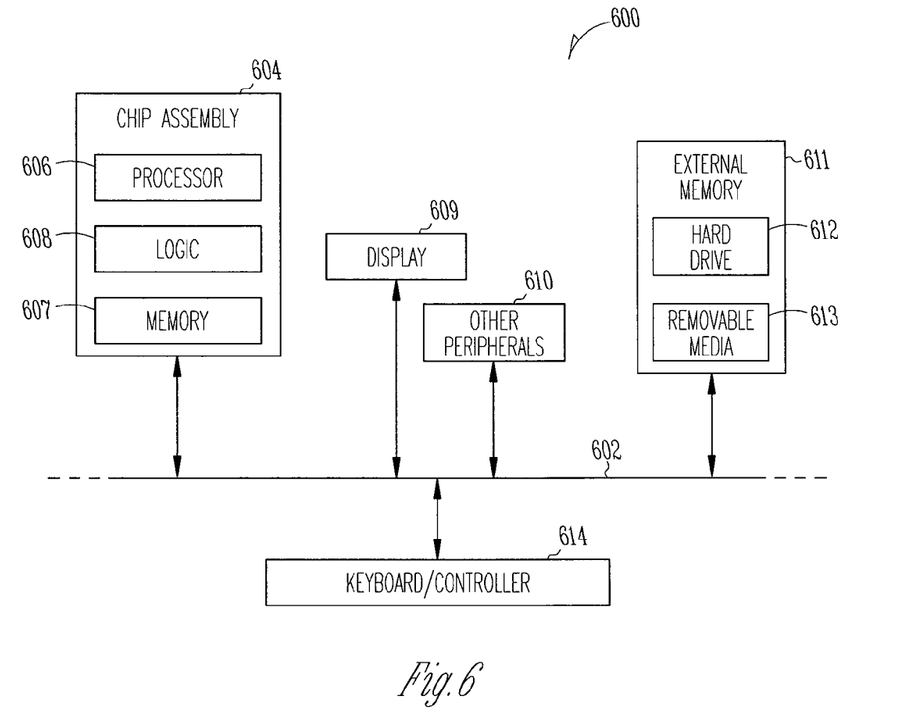
FIG. 6 shows an information handling system that includes an example memory cell according to an embodiment of the invention.

An embodiment of an information handling system such as a computer is included in FIG. 6 to show an embodiment of a high-level device application for the present invention. FIG. 6 is a block diagram of an information handling system 600 incorporating at least one memory device according to embodiments of the invention as described above. Information handling system 600 is merely one embodiment of an electronic system in which the present invention can be used. Other examples include, but are not limited to, netbooks, cameras, personal data assistants (PDAs), cellular telephones, MP3 players, aircraft, satellites, military vehicles, etc.

In this example, information handling system 600 comprises a data processing system that includes a system bus 602 to couple the various components of the system. System bus 602 provides communications links among the various components of the information handling system 600 and may be implemented as a single bus, as a combination of busses, or in any other suitable manner.

Die assembly 604 is coupled to the system bus 602. Die assembly 604 may include any circuit or operably compatible combination of circuits. In one embodiment, die assembly 604 includes a processor 606 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory 607 is included in the die assembly 604. In one embodiment, the memory 607 includes a stack of memory dies, including one or more buffer dies as described in embodiments above. In one embodiment, one or more command dies 608 are included in the die assembly 604 as described in embodiments above.

Information handling system 600 may also include an external memory 611, which in turn can include one or more memory elements suitable to the particular application, such as one or more hard drives 612, and/or one or more drives that handle removable media 613 such as floppy diskettes, compact disks (CDs), flash drives, digital video disks (DVDs), and the like. A memory constructed as described in examples above is included in the information handling system 600.

Information handling system 600 may also include a display device 609 such as a monitor, additional peripheral components 610, such as speakers, etc. and a keyboard and/or controller 614, which can include a mouse, trackball, game controller, voice-recognition device, or any other device that permits a system user to input information into and receive information from the information handling system 600.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A device, comprising:
   a stack of memory dies;
   a command die coupled to communicate with the stack of memory dies; and
   a plurality of buffer dies stacked within the stack of memory dies, wherein the plurality of buffer dies are each configured to communicate with the command die, and repeat a signal between the command die and a downstream memory die in the stack of memory dies, and wherein a first buffer die is configured to communicate with a second buffer die, wherein both the first and second buffer dies are within the stack of memory dies, and the first and second buffer dies are separated from one another by one or more intermediate memory dies.

2. The device of claim 1, wherein at least one of the plurality of buffer dies is also configured to function as a memory die.

3. The device of claim 1, wherein the command die is also configured to function as a memory die.

4. The device of claim 1, wherein a first buffer die is configured to communicate with downstream memory devices using a through silicon via.

5. The device of claim 4, wherein the first buffer die is configured to communicate with the command die using a bypass through silicon via.

6. The device of claim 1, wherein at least one of the plurality of buffer dies is configured to communicate with a memory die above the at least one buffer die, and is also configured to communicate with a memory die below the at least one buffer die.

7. The device of claim 1, wherein the command die is stacked with the stack of memory dies.

8. The device of claim 1, wherein a communication path between dies in the stack of memory dies comprises a bi-directional communication path.

9. The device of claim 1, wherein a communication path between dies in the stack of memory dies comprises a unidirectional communication path.

10. A memory device, comprising:
    a stack of memory dies;
    a command die to communicate with the stack of memory dies;
    a plurality of buffer dies stacked within the stack of memory dies, wherein the plurality of buffer dies are each configured to communicate with the command die, and repeat a signal between the command die and a downstream memory die in the stack of memory dies, and wherein a first buffer die is configured to communicate with a second buffer die, wherein both the first and second buffer dies are within the stack of memory dies, and the first and second buffer dies are separated from one another by one or more intermediate memory dies; and
    a power regulation circuit in at least one buffer die.

11. The memory device of claim 10, wherein the power regulation circuit comprises a voltage boosting circuit.

12. The memory device of claim 10, wherein the power regulation circuit comprises a noise reduction circuit.

13. The device of claim 10, wherein the command die is stacked with the stack of memory dies.

14. The device of claim 10, wherein a communication path between dies in the stack of memory dies comprises a bi-directional communication path.

15. The device of claim 10, wherein a communication path between dies in the stack of memory dies comprises a unidirectional communication path.

16. The device of claim 10, wherein at least one of the plurality of buffer dies is configured to communicate with a memory die above the at least one buffer die, and is also configured to communicate with a memory die below the at least one buffer die.

17. A device, comprising:
    a stack of memory dies;
    a command die coupled to communicate with the stack of memory dies;
    a plurality of buffer dies stacked within the stack of memory dies, including a first buffer die, and a second buffer die between the first buffer die and the command die;
    wherein the plurality of buffer dies are each configured to communicate with the command die, and repeat a signal between the command die and a downstream memory die in the stack of memory dies;
    a bypass through silicon via coupled directly between the command die and the first buffer die; and
    a power regulation circuit in at least one buffer die that includes functionality to put one or more dies in the stack of memory dies into a low power mode.

18. The device of claim 17, wherein the second buffer die is configured to communicate with a memory die above the second buffer die, and is also configured to communicate with a memory die below the second buffer die.

19. The device of claim 18, wherein the first buffer die is configured to communicate with a memory die above the first buffer die, and is also configured to communicate with a memory die below the first buffer die.

* * * * *